(12) United States Patent
Bargstädt-Franke et al.

(10) Patent No.: US 6,930,501 B2
(45) Date of Patent: Aug. 16, 2005

(54) METHOD FOR DETERMINING AN ESD/LATCH-UP STRENGTH OF AN INTEGRATED CIRCUIT

(75) Inventors: Silke Bargstädt-Franke, München (DE); Kai Esmark, München (DE); Harald Gossner, Riemerling (DE); Philipp Riess, Munich (DE); Wolfgang Stadler, München (DE); Martin Streibl, Petershausen (DE); Martin Wendel, Hohenbrunn (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/866,863

(22) Filed: Jun. 14, 2004

(65) Prior Publication Data

US 2005/0003564 A1 Jan. 6, 2005

Related U.S. Application Data

(63) Continuation of application No. PCT/DE02/04599, filed on Dec. 16, 2002.

(30) Foreign Application Priority Data

Dec. 19, 2001 (DE) .......................................... 101 62 542

(51) Int. Cl.⁷ ............................................. G01R 31/26
(52) U.S. Cl. .................... 324/763; 324/765; 324/158.1; 324/769; 361/111
(58) Field of Search ................................. 324/763, 765, 324/754, 158.1, 72.5, 769; 361/111, 56, 91.5; 327/314, 330; 257/48; 438/14, 18, 17

(56) References Cited

U.S. PATENT DOCUMENTS 5,523,252 A 6/1996 Saito
5,561,373 A 10/1996 Itoh (Continued)

FOREIGN PATENT DOCUMENTS

JP 05-256899 8/1993

OTHER PUBLICATIONS

"Latch–Up Characterization Using Novel Test Structures and Instruments", Carles Cané, Manuel Lozano, Enric Cabruja, José Anguita, Emilio Lora–Tamayo and Francisco Serra–Mestres, IEEE Transactions on Semiconductor Manufacturing, vol. 4, No. 3, Aug., 1991, pp. 199–205.

Modified Transmission Line Pulse System and Transistor Test Structures For The Study of ESD, Robert A. Ashton, Proceedings IEEE Int. Conference on Microelectronic Test Structures, vol. 8, Mar., 1995, pp. 127–132.

*Primary Examiner*—David Zarneke
*Assistant Examiner*—Jimmy Nguyen
(74) *Attorney, Agent, or Firm*—Eschweiler & Associates LLC

(57) ABSTRACT

A method for determining an ESD/latch-up strength of an integrated circuit includes producing an integrated circuit and a test structure using the same fabrication process. Electrical parameters at the test structure are measured and characteristic values associated with the integrated circuit are derived from the measured parameter values, wherein the characteristic values characterize an ESD or latch-up characteristic curve associated with the integrated circuit. The method further includes testing whether the characteristic values in each case lie within a predetermined range assigned to them, wherein the ranges are chosen such that a desired ESD/latch-up strength is present if the characteristic values in each case lie within their range.

13 Claims, 2 Drawing Sheets

U.S. PATENT DOCUMENTS

| | | | | |
|---|---|---|---|---|
| 5,654,863 A | * | 8/1997 | Davies | 361/111 |
| 5,675,260 A | | 10/1997 | Consiglio | |
| 5,818,235 A | * | 10/1998 | Simonov et al. | 324/457 |
| 5,923,160 A | * | 7/1999 | DeChiaro et al. | 324/72.5 |
| 5,978,197 A | * | 11/1999 | Chan | 361/111 |
| 5,990,488 A | | 11/1999 | Nistler et al. | |
| 6,205,408 B1 | * | 3/2001 | Jubin et al. | 702/182 |
| 6,265,885 B1 | * | 7/2001 | Luo et al. | 324/719 |

* cited by examiner

METHOD FOR DETERMINING AN ESD/LATCH-UP STRENGTH OF AN INTEGRATED CIRCUIT

REFERENCE TO RELATED APPLICATIONS

This application is a continuation of PCT/DE02/04599 filed Dec. 16, 2002, which was not published in English, that claims the benefit of the priority date of German Patent Application No. 10162542.1, filed on Dec. 19, 2001, the contents of which both are herein incorporated by reference in their entirety.

FIELD OF THE INVENTION

The invention relates to a method for determining an ESD/latch-up strength of an integrated circuit

BACKGROUND OF THE INVENTION

During the manufacture and handling of an integrated circuit, electrostatic discharges can occur at the terminals of the integrated circuit, instances of destruction occurring when the loading limit of the affected circuit section of the integrated circuit is exceeded. In order to afford protection from electrostatic discharges (ESD), therefore, an integrated circuit generally contains at least one ESD protection device. In order to determine the ESD strength of the integrated circuit, the integrated circuits processed on a wafer are singulated and from these individual circuits are selected and built up into a housing and then measured in a special ESD test unit. On account of the necessary construction of the integrated circuits and on account of the complex test methodology, times of several days to weeks are necessary in order to be able to determine the ESD strength on the basis of the integrated circuits.

Furthermore, loaded integrated circuits must not be passed to customers, and the loaded circuits are often destroyed in the course of determining the ESD strength, thus giving rise to high costs since the measurement conditions (high costs in the amperes range and pulse duration in the nano seconds range) are far from the standard operating conditions of the integrated circuits, special (expensive and difficult to control) measuring units are required for the measurement.

The latch-up strength of the integrated circuit (latch-up is understood to be the triggering of a parasitic thyristor) also has to be examined in a highly time-consuming manner, since the integrated circuit has to be singulated, built up and measured. Furthermore, the measured circuits in turn can generally no longer be used.

Since the methods described can only ever be used to examine individual integrated circuits in current production, the measurement results may, under certain circumstances, not be representative. In particular, results of one integrated circuit cannot be applied to other integrated circuits. This means that a statement about the ESD strength of the technology is also not possible. Even if the measurement results are representative and it is ascertained that the ESD/latch-up strength is insufficient, there is the difficulty that production has continued in the meantime (during the measurement time) and, consequently, a very large number of reject products have been produced. Furthermore, it is also extremely difficult to ascertain why the ESD/latch-up strength was insufficient and what process parameters are responsible for this. This often requires further, very complex examinations, as a result of which the time expenditure and costs increase further.

The document U.S. Pat. No. 5,523,252 describes a method for determining the electrostatic properties of an integrated circuit. In this case, a test component is provided and the power required to electrostatically destroy the test component is measured. In this case, the power is increased stepwise up to destruction.

SUMMARY OF THE INVENTION

It is an object of the invention to provide a method for determining an ESD/latch-up strength of an integrated circuit by means of which the difficulties described in the introduction are as good as completely eliminated.

According to the invention, the object is achieved by means of a method for determining an ESD/latch-up strength of an integrated circuit.

What is advantageously achieved by means of this method is that, rather than the integrated circuit itself, a test structure is measured, so that the integrated circuit is not impaired or even destroyed by the measurement. Thus, an indirect determination of the ESD/latch-up strength of the integrated circuit is carried out. However, the test structure can be chosen such that not only is it ascertained whether or not a desired ESD/latch-up strength is present, but also, if the desired ESD/latch-up strength is not present, why this is the case.

Consequently, the ESD/latch-up strength can be determined by means of the method according to the invention on the basis of technological parameters that are simple to measure.

Furthermore, it is also not necessary to go through the entire ESD or latch/up characteristic curve during the measurement, rather only the individual characteristic values that characterize the corresponding characteristic curve are derived from measured values that are simple to determine and are obtained during the measurement of the test structure (and not by measurement of the integrated circuit). In this case, it is also necessary only to carry out point-like measurements at the test structure. As a result, the necessary measurement can be performed extremely rapidly as a result of which a larger number of integrated circuits can be examined with regard to their ESD/latch-up strength. It is even possible to carry out a continuous process monitoring. It is thus no longer individual finished products or integrated circuits that are tested, rather an effective process monitoring is carried out which may perfectly well encompass a plurality of different products of a technology.

In particular, in the method according to the invention, the test structure may be produced with a test element at which a plurality of the parameters are measured in the measurement step. This makes it possible to reduce the space requirement of the test structure, as a result of which there is more space for the integrated circuit on the wafer on which the integrated circuit and the test structure are produced.

A preferred development of the method according to the invention resides in the fact that the integrated circuit (1, 2) and the test structure are produced on the same wafer and the measurement is carried out before the singulation of the integrated circuit. Consequently, measurement of the test structure is effected while still at the wafer level, so that, as early as at this point in time, it is possible to definitively ascertain whether the necessary ESD/latch-up strength is present. If it is not present, the integrated circuit can immediately be identified as a reject and it is no longer necessary to carry out the subsequent manufacturing steps such as, for example, the singulation (e.g., sawing out) and the bonding. Costs can thereby be saved. It is also possible to reliably avoid a delivery of integrated circuits which do not achieve a specific, previously defined ESD strength and which would otherwise be used in safety-relevant areas (e.g., in the automotive industry, in particular for airbag controllers).

In particular, the wafer level measurement can already be carried out when the test structure has already been completed but not all of the process steps which the wafer has to undergo have yet been effected. The method according to the invention thus makes it possible to carry out a temporally very early test for ESD/latch-up strength, as a result of which subsequent manufacturing steps, if the ESD/latch-up strength is inadequate, and thus also costs and time can be saved.

Furthermore, it is also possible to carry out the determination of the ESD/latch-up strength of the integrated circuit together with the process monitoring that is customary in semiconductor fabrication by means of PCM measurement (PCM=Process Control Monitor). In this case, the PCM testers that are already present may also be used, so that the method according to the invention can readily be incorporated into the fabrication process of integrated circuits (preferably in the context of the PCM monitoring).

Furthermore, in the method according to the invention, a plurality of integrated circuits may be produced, the test structure then preferably being formed between the integrated circuits. The space present between the integrated circuits, said space being necessary for example for the singulation of the integrated circuit, is thereby utilised effectively. Moreover, the test structure is thereby fabricated in direct proximity to the integrated circuit whose ESD/latch-up strength is to be checked, thus enabling the strength to be determined extremely exactly since, by way of example, fluctuations of process parameters or altered process implementations affect the integrated circuit and the test structure in the same way.

One development of the method according to the invention resides in the fact that at least one of the regions is a region that is open on one side. This makes it possible to check particularly rapidly whether the characteristic value lies in the range assigned to it. It is merely necessary to check whether the characteristic value exceeds or falls below a limit value. The testing step can thus be implemented easily, on the one hand, and be carried out very rapidly, on the other hand.

In the method according to the invention, a DC voltage or a DC current may be impressed on a test element of the test structure in order to measure at least one of the parameters and the value of said one parameter may be determined in this case. As a result, only a simple DC current or DC voltage measuring method has to be carried out, which can be carried out more rapidly and can be handled more simply than, for example, the measuring methods employing high-current pulse generators that have been used hitherto for determining the ESD strength which, for measurement purposes, generate pulses having a pulse duration of 100 ns and a current of greater than 1.5 A. This DC current or DC voltage measurement may be carried out for example using a conventional PCM tester, so that the method according to the invention can be easily implemented and incorporated into the process monitoring.

Furthermore, in the method according to the invention, the test structure may be produced with a plurality of test elements, in which case measurement is then effected simultaneously in the measurement step at the plurality of test elements. This leads to a further increase in the measurement speed, thereby decreasing the measurement-dictated delay in the fabrication of the integrated circuit. This makes it possible to increase the throughput during fabrication.

In particular, in the method according to the invention, the integrated circuit may be produced with an ESD protection device and a circuit (e.g., an active and/or passive circuit) to be protected and the test structure can be produced with an ESD test element assigned to the ESD protection device and a circuit test element assigned to the circuit (e.g., an active and/or passive circuit), the characteristic values derived being used to determine whether there is a predetermined relationship between an ESD characteristic curve of the ESD protection device and an ESD characteristic curve of the circuit (e.g., an active and/or passive circuit). This makes it possible to carry out an indirect determination of the ESD characteristic curve of the ESD protection device and the ESD characteristic curve of the circuit (e.g., an active and/or passive circuit), and, in particular, also a comparison of the two characteristic curves, as a result of which it is possible to make extremely exact statements about the ESD strength and also about possibly critical characteristic curve relationships.

Moreover, the ESD protection device may have a protection transistor and the ESD test element may have a corresponding test transistor, the test transistor being fabricated with smaller dimensions than the protection transistor. On the one hand, this leads to a space saving since the ESD protection devices, in particular have a large space requirement, and, on the other hand, with significantly smaller current values than in the actual ESD case, it is possible to generate the same current densities in the protection transistor. As a result, exact statements in particular about the high-current behavior of the ESD protection device can be obtained in a simple manner.

In the method according to the invention for determining the ESD strength, in particular those characteristic values are determined which characterize a leakage current, an ESD trigger voltage, an ESD holding voltage, a differential ESD high-current resistance and an ESD current-carrying capacity of the ESD protection device and/or the integrated circuit to be protected. The most relevant points in the ESD characteristic curve are thus registered, as a result of which accurate statements about the ESD strength can be derived.

Moreover, in the method according to the invention, different test elements may be formed for different component classes (for example with different maximum supply voltages, e.g., 1.2 and 3.3 volts) in the test structure. Thus, one test structure can be used to monitor different voltage classes with regard to ESD/latch-up strength.

In particular, in the method according to the invention, the test structure may be produced with a thyristor, the characteristic values derived being used to determine whether a trigger voltage and a trigger current of a parasitic thyristor of the integrated circuit in each case exceed predetermined minimum values. The thyristor of the test structure that is produced is preferably one which is representative of the worst-case parasitic thyristor of the integrated circuit. As a result, a measurement at the thyristor of the test structure can be used to deduce the trigger voltage and the trigger current of the parasitic thyristor of the integrated circuit.

In particular in the method according to the invention, those characteristic values are determined which characterize a latch-up trigger voltage, a latch-up trigger current, a latch-up holding voltage and/or a latch-up holding current. The most relevant points of the latch-up characteristic curve are thereby registered, as a result of which it is possible to make very exact statements about the latch-up strength.

Furthermore, in the method according to the invention, a breakdown test element is produced in the test structure, the characteristic values determined being used to determine whether a breakdown voltage of a parasitic element of the integrated circuit exceeds a predetermined value. This is relevant in particular to the ESD strength, since the voltage in the case of the (maximum) ESD current-carrying capacity should be lower than the breakdown voltage of the parasitic element. Consequently, the ESD/latch-up strength of the integrated circuit can be determined very accurately.

BRIEF DESCRIPTION OF THE DRAWINGS

The invention will be explained in more detail below by way of example with reference to the drawings, in which.

DETAILED DESCRIPTION OF THE INVENTION

Figure 1:
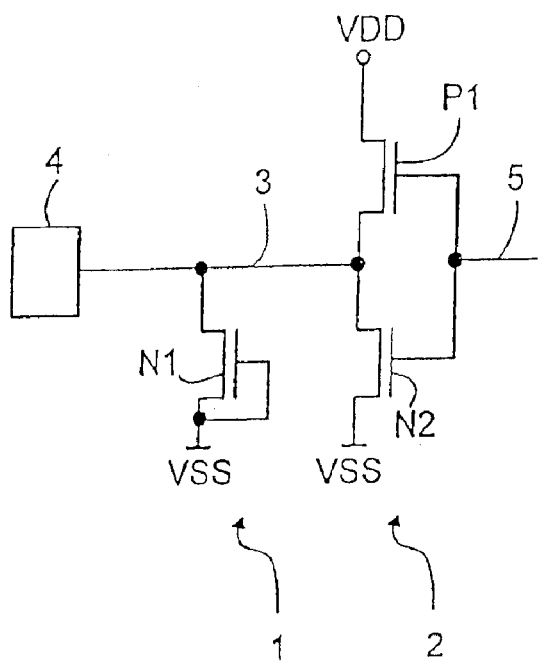
FIG. 1 shows a schematic illustration of a section of an integrated circuit.

FIG. 1 schematically shows an example of a part of an integrated circuit whose ESD/latch-up strength is intended to be determined. That part of the integrated circuit which is shown in FIG. 1 comprises an ESD protection device 1 and also a circuit 2 to be protected (e.g. active and/or passive circuit), both of which are connected to a contact area 4 via an output line 3.

In the example shown, the ESD protection device 1 contains an n-channel field-effect transistor N1, the drain terminal of which is connected to the output line 3 and the gate and source terminals of which are jointly connected to ground VSS. In the example shown here, the active circuit 2 is an output driver having a p-channel field effect transistor P1 and an n-channel field effect transistor N2, which are connected in series between supply voltage VDD and ground VSS and the gate terminals of which are connected to one another and can be driven via a line 5 leading into the integrated circuit.

Figure 2:
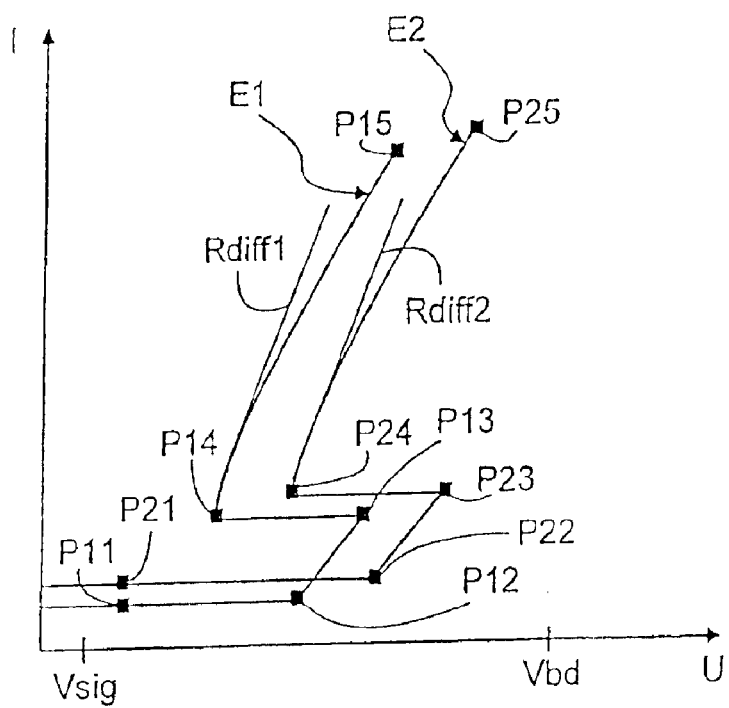
FIG. 2 shows a diagram with two ESD characteristic curves.

FIG. 2 schematically illustrates a desired ESD characteristic curve E1 of the ESD protection device 1 and a desired ESD characteristic curve E2 of the active circuits 2, the voltage U being plotted along the x-axis and the current I being plotted along the y-axis.

In order to protect the active circuit 2 against an ESD event, the current-voltage ESD characteristic curve E1 of the ESD protection device 1 above the maximum signal voltage Vsig (=VDD) for a given voltage value, derived from the ESD current, must always have a larger current value than the current-voltage ESD characteristic curve E2 of the circuit 2 to be protected, so that the current pulse of an ESD event is principally dissipated by the ESD protection device 1. Furthermore, the leakage current of the ESD protection device 1 must not be too high in normal operation at voltages up to the maximum signal voltage Vsig, since the ESD protection device 1 would otherwise impair the normal operation of the active circuit 2 to an excessively great extent.

In order to assess these conditions, however, the ESD characteristics E1 and E2 do not at all have to be measured directly and exactly and, in particular, also do not have to be measured completely. This is because both ESD characteristic curves E1 and E2 can be described by means of current/voltage values of some distinguished points at least to an extent such that it is possible to reliably assess whether the ESD protection device 1 ensures the desired ESD protection of the active circuit 2.

Distinguished points of the ESD characteristic curves E1 and E2 are, in particular, the leakage current Ileak1, Ileak2 of one application of the maximum signal voltage Vsig (points P11, P21), the breakdown voltage of the Vbd1, Vbd2 (points P12, P22), the trigger voltage Vt11, Vt12 (points P13, P23), the holding voltage Vh1, Vh2 (points P14, P24), the differential high-current resistance Rdiff1, Rdiff2, and also the maximum current-carrying capacity It21, It22 (points P15, P25).

Each protection element (e.g., diode, thyristor or else more complex protection circuits) can be described by such a characteristic curve E1. In the case of a diode, e.g., the trigger and holding voltages coincide with the breakdown voltage.

In order, then, to be able to determine the ESD and/or latch-up strength (or ESD/latch-up strength) of the integrated circuit, a test structure is produced together with the integrated circuit by means of the same process steps on the same wafer. Electrical parameters are then measured at the test structure, preferably the characteristic values of the ESD characteristic curves E1 and E2 as specified above being derived from the measured parameter values. Consequently, a measurement at the integrated circuit itself is not necessary.

Figure 3:
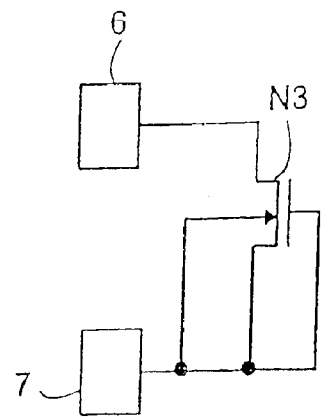
FIG. 3 shows a schematic illustration of an ESD test element.

FIG. 3 shows, by way of example, an element of the test structure which is used for determining the ESD strength of the ESD protection device 1. What is involved in this case is an n-channel MOS field-effect transistor N3, the drain terminal of which can be contact-connected via a pad 6 and the gate, source and bulk terminals of which are connected to one another and can also be contact-connected via a pad 7. Since ESD protection devices are generally relatively large, it is preferred for the ESD test element to be produced smaller. As a result, the size of the test structure is reduced and it is possible to generate the same current densities with smaller voltages.

In the example described here of a 0.13 mm technology with a supply voltage of 1.2 volts, the ESD test element N3 has a W/L ratio of 100 mm/0.12 mm (W/L corresponds to gate width/gate length), while the n-channel MOS field-effect transistor N1 of the ESD protection device 1 has a W/L ratio of 200 mm/0.12 mm.

Various measurements, from which the above characteristic values of the ESD characteristic curve E1 can be derived, are described below in particular with reference to the ESD test element shown in FIG. 3.

Thus, the leakage current Ileak1 is determined by connecting the pad 7 to ground VSS and by applying to the pad 6 a voltage which is somewhat higher than the maximum signal voltage Vsig. In the example described here, the maximum signal voltage Vsig is 1.2 volts and approximately a value 10% higher is applied. The current that flows between the two pads 6 and 7 in this case is determined. The measured current value must lie below a predetermined current value, which may be 1 mA, for example, in order that the leakage current is small enough and thus acceptable for an integrated circuit.

The trigger voltage Vt11 is derived next. For this purpose, a voltage which is somewhat greater than the predetermined trigger voltage is impressed on the n-channel field-effect transistor N3. In the example described here, the predetermined trigger voltage is approximately 5.7 V and a voltage which is approximately 10% higher is impressed, so that the impressed voltage is approximately 6.3 volts. The current that flows in this case is measured, the current measurement being carried out with current limiting. The current limiting is chosen such that it is somewhat greater than the current which flows directly after the triggering (jump from point P13 to point P14) of the ESD test element, that is to say the current at the point P14. This current is approximately 1 mA, so that the current limiting can be set to 10 mA, for example.

During the measurement, it is then ascertained whether or not the current limiting responds. If it does respond, the ESD test element has been triggered and it is possible to derive from this that the predetermined trigger voltage Vt11 is small enough. If the current limiting does not respond, what is derived from this is that the trigger voltage Vt11 must be greater than the impressed voltage, which is not desired and which may have the effect that the ESD protection device 1 does not ensure the planned ESD protection. Consequently, it is extremely simple to determine the trigger voltage, which is otherwise difficult to measure.

In order to derive the holding voltage Vh1, a current which is somewhat greater than the trigger current It11 (at the point P13) impressed on the ESD test element. In the case of a trigger current It11 of 1 mA, for example, a current of 10 mA may be impressed but the voltage dropped in this case then approximately corresponds to the holding voltage Vh1. The error made by impressing a larger current than the trigger current can be reduced for example by subtracting the voltage component on account of the higher impressed current (higher than the trigger current value at the point P13) from the measured voltage by means of the differential resistance Rdiff1.

The holding voltage Vh1 thus determined must be greater than the maximum signal voltage Vsig, a certain safety margin with respect to the signal voltage Vsig preferably also being demanded. Furthermore, the holding voltage Vh1 must also be less than the holding voltage Vh2 (point P24) of the active circuit 2 in order to ensure the relationship of the two ESD characteristic curves E1, E2 which is shown in FIG. 2. The determination of the characteristic values of the active circuits 2 is described below.

In order to derive the differential resistance Rdiff1, a corresponding diffusion region is formed (not shown) in the test structure, the sheet resistance being measured at said diffusion region. If the technology comprises for example silicide or salicide layers for reducing the resistance, the diffusion region is formed without such layers since it is desired to measure the resistance of the diffusion layer.

The measured sheet resistance is used to calculate the corresponding differential high-current resistance Rdiff1 of the ESD protection device 1 in accordance with its actual dimensions. The differential high-current resistance Rdiff1 must be chosen such that the voltage at the point P15 of the ESD characteristic curve E1 is less than the breakdown voltage Vpara of parasitic elements, such as e.g. a gate oxide breakdown voltage, by way of preventing destruction of these elements in the ESD case.

For determining the maximum current-carrying capacity (current It21 at the point P15; at still higher currents, thermal destruction of the element occurs), the test structure contains a further n-channel field-effect transistor (not shown), which is connected in the same way as that shown in FIG. 3, but its W/L ratio is 10 mm/0.12 mm, so that, by means of a relatively low DC current (e.g., 50 to 60 mA), the current density which is present in the ESD protection device 1 in the ESD case can be generated in the further n-channel field-effect transistor.

In order to derive the current It21, a DC current of approximately 50 to 60 mA is impressed momentarily (in the millisecond range) on the further n-channel field-effect transistor. Afterward, a leakage current measurement is once again carried out at said n-channel field-effect transistor with a voltage that is, e.g., 10% higher than the maximum signal voltage. By way of example, the stipulation that the leakage current must be less than a predetermined maximum leakage current of 1 mA, for example, may be defined as a criterion for the evaluation of the measured leakage current. It is also possible to choose the criterion that the measured leakage current is to be less than the leakage current of the n-channel field-effect transistor N3 or less than a multiple thereof.

In order to derive the breakdown voltage Vpara (FIG. 2) of the parasitic elements of the integrated circuit (preferably of parasitic elements in the region of the ESD protection device), the test structure contains further test elements in which, by way of example, two metal conductors are spaced apart from one another and insulated. A voltage at the level of the breakdown voltage Vpara is impressed and a measurement is effected to determine whether current flows. If current does flow, a breakdown has taken place and the breakdown voltage Vpara is too low. If current does not flow, a sufficiently high dielectric strength is present. In this manner, it is possible to provide even further test elements for further breakdown voltage measurements (e.g., for a gate oxide breakdown).

For the active circuits 2, test structures corresponding to those for the ESD protection device 1 are provided and corresponding measurements are carried out, so that the relevant values can also be determined for the ESD characteristic curve E2.

Since only a DC current or a DC voltage has to be impressed during the measurements described, the measurements can be carried out very rapidly. Thus, it is possible to monitor each wafer produced, so that the ESD strength can be monitored continuously (e.g., in the context of the customary process monitoring).

Of course, the ESD protection circuit 1 can have more elements than the n-channel transistor N1 described previously. Thus, the ESD protection circuit may comprise further transistors, diodes and resistors. In this case, it may be necessary to provide further test elements in the test structure. However, the basic idea of evaluating the ESD strength of the integrated circuit on the basis of the parameter values determined by measurements is maintained. A process monitoring of the ESD strength can thus be realised by means of very simple measurements that can be carried out rapidly.

The latch-up strength of the integrated circuit can be determined like the ESD strength using a test structure which is produced together with the integrated circuit by means of the same steps on a single wafer.

Figure 4:
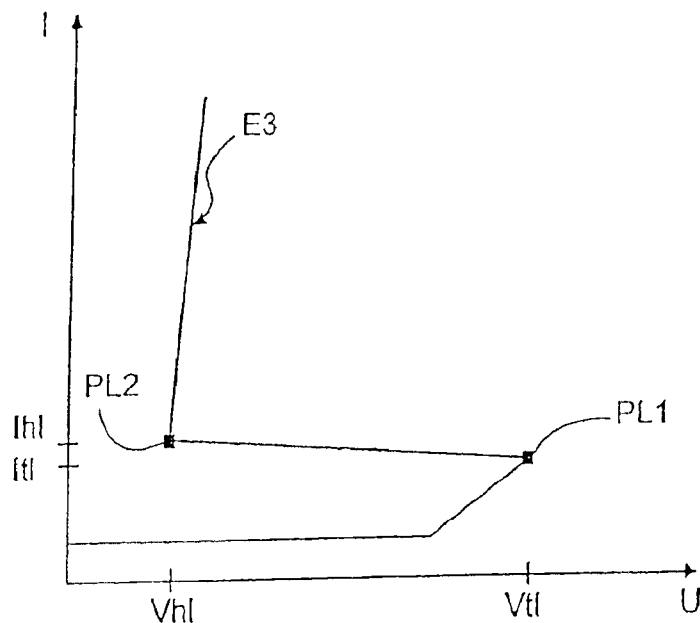
FIG. 4 shows a diagram with a latch-up characteristic curve.

FIG. 4 shows a typical latch-up characteristic curve E3, which reveals that the latch-up structure triggers (point PL1) at a trigger voltage Vtl and a trigger current Itl, jumps back (point PL2) to a holding voltage Vhl with a holding current Ihl and then rises sharply in low-impedance fashion. The relevant points here are the points PL1 and PL2 (in particular here trigger current Itl and holding voltage Vhl).

Figure 5:
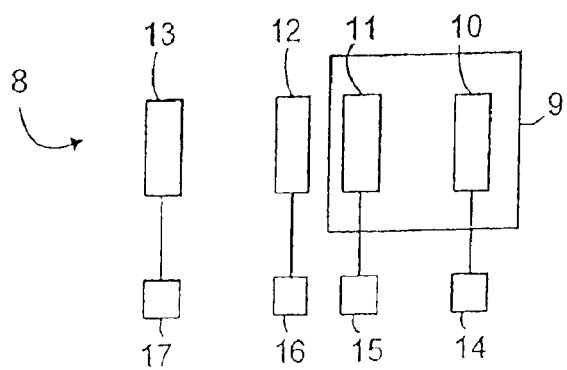
FIG. 5 shows a schematic illustration of a latch-up test element.

In order to determine these characteristic values, a four-terminal component 8 illustrated schematically in FIG. 5 is produced in the test structure, said component representing the worst-case scenario of a parasitic thyristor in the integrated circuit. The four-terminal component 8 comprises a typical thyristor structure: a well terminal 10 and a p+-type region 11 are provided in an n-type well 9 and an n+-type region 12 and a p-type terminal 13 are formed adjacent to the n-type well 9. The well terminal 10 and the p-terminal 13 and also the n+-type and p+-type regions 11, 12 are respectively connected to a pad 14, 15, 16, 17, via which voltages and currents can be variably impressed and measured.

In order to determine the trigger voltage Vtl of the characteristic curve E3 (in the case of negative injection), the supply voltage VDD is in each case applied to the pads 14 and 15 and the pad 17 is connected to ground VSS. A voltage which is approximately 10% lower than the desired trigger voltage Vtl is applied to the pad 16, the trigger voltage being approximately VDD+1 volt. The current that flows in this case between the pads 14 and 17 is measured, a current limiting preferably being set. The current limiting is set to a value which is somewhat greater than the holding current Ihl. If the current limiting takes effect, then, during the measurement, the trigger voltage Vtl is too low. If the current limiting does not take effect, the trigger voltage Vtl is high enough. Thus, simply by evaluation of whether or not the current limiting became active, it is possible to derive that the trigger voltage is or is not within the permissible range.

The method proceeds correspondingly for positive injection; in this case, the impressing is effected into the pad 15, the impressed voltage being approximately 10% lower than the desired trigger voltage Vtl (−1V) and, consequently, being approximately −0.9V. In this case, the pads 16 and 17 are connected to ground VSS and VDD is present at the pad 14.

In order to measure the trigger current Itl, in contrast to the above measurement, a voltage V is impressed at the pad 16 (negative injection) or 15 (positive injection), which voltage is somewhat greater than the trigger voltage Vtl, and the current that occurs in this case is measured. Thus, the current in the snapback path from PL1 to PL2 is measured and then the measurement is ended, so that the trigger current Itl can be determined. This measured trigger current Itl must be greater than a minimum trigger threshold in order that a sufficient latch-up strength is provided.

Furthermore, the holding voltage Vhl is also determined by impressing a current via the pad 16 (negative injection) or 15 (positive injection), which current is minimally greater than the trigger current Itl. The rest of the pads are connected up in the same way as in the case of the two above measurements at the four-terminal structure 8. The voltage that occurs in this case must be greater than a minimum holding voltage, which is preferably greater than the maximum signal voltage Vsig.

Thus, the latch-up strength of the integrated circuit can also be determined on the basis of a few short measurements at a test structure, so that a continuous process monitoring can be carried out.

Of course, even further test structures (in particular four-terminal structures with other dimensions) may be provided in order to monitor further critical parasitic thyristors in the integrated circuit with regard to its latch-up strength. However, it is also possible only to provide the described four-terminal structure 8 once or a number of times (with virtually the same dimensions) in order to determine and to continuously monitor the latch-up strength for different component classes (e.g., with a different maximum supply voltage).

What is claimed is:

1. A method for determining an ESD/latch-up strength of an integrated circuit, comprising:

producing an integrated circuit and a test structure with the same fabrication process;

impressing a DC voltage or a DC current on a test element of the test structure;

measuring at least one electrical parameter, wherein the value of said one parameter is determined by a DC current or a DC voltage measurement;

deriving characteristic values from the at least one measured parameter, the derived characteristic values characterizing an ESD or latch-up characteristic curve associated with the integrated circuit; and testing whether the characteristic values in each case lie within a predetermined range assigned to them, the ranges being chosen such that a desired ESD/latch-up strength is present if the characteristic values in each case lie within their range.

2. The method as claimed in claim 1, wherein the test structure is produced with the test element at which a plurality of parameters are measured in the measurement step.

3. The method as claimed in claim 1, wherein the integrated circuit and the test structure are produced on the same wafer and the measurement is carried out before the singulation of the integrated circuit from other integrated circuits on the wafer.

4. The method as claimed in claim 1, wherein a plurality of integrated circuits are produced on a wafer and the test structure is formed on the wafer between the integrated circuits.

5. The method as claimed in claim 1, wherein at least one of the regions is a region that is open on one side.

6. The method as claimed in claim 1, wherein the test structure is produced with a plurality of test elements and wherein the test elements are measured concurrently in the measurement step.

7. The method as claimed in claim 1, wherein the integrated circuit is produced with an ESD protection device and a circuit to be protected, and the test structure is produced with an ESD test element associated with the ESD protection device and a circuit test element associated with the circuit, wherein the derived characteristic values are used to determine whether there is a predetermined relationship between an ESD characteristic curve of the ESD protection device and an ESD characteristic curve of the circuit.

8. The method as claimed in claim 7, wherein the ESD protection device comprises a protection transistor and the ESD test element comprises a test transistor, wherein the test transistor is smaller than the protection transistor.

9. The method as claimed in claim 7, wherein the derived characteristic values characterize an ESD trigger voltage, an ESD holding voltage, a differential ESD high-current resistance or an ESD current-carrying capacity of the ESD protection device or the active circuit to be protected.

10. The method as claimed in claim 1, wherein different test elements are formed for different component classes in the test structure.

11. The method as claimed in claim 1, wherein the test structure comprises a thyristor, and wherein the derived characteristic values are used to determine whether a trigger voltage and a trigger current of a parasitic thyristor of the integrated circuit in each case exceed predetermined minimum values.

12. The method as claimed in claim 1, wherein the derived characteristic values characterize a latch-up trigger voltage, a latch-up trigger current, a latch-up holding voltage or a latch-up holding current.

13. The method as claimed in claim 1, wherein a breakdown test element is produced in the test structure, and the derived characteristic values are used to determine whether a breakdown voltage of a parasitic element of the integrated circuit exceeds a predetermined value.

* * * * *